(12) United States Patent
Yesh et al.

(10) Patent No.: US 12,012,320 B2
(45) Date of Patent: *Jun. 18, 2024

(54) DEPLOYABLE MOBILE TRANSPORTERS FOR EASY PLANT RECONFIGURATION

(71) Applicant: Ford Global Technologies, LLC, Dearborn, MI (US)

(72) Inventors: Kenneth Yesh, Dearborn, MI (US); Anthony Mario D'Amato, Canton, MI (US); Shankar Narayan Mohan, Ann Arbor, MI (US); Mario Anthony Santillo, Canton, MI (US); Gregory P. Linkowski, Dearborn, MI (US); Meghna Menon, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 22 days.

This patent is subject to a terminal disclaimer.

(21) Appl. No.: 17/954,804

(22) Filed: Sep. 28, 2022

(65) Prior Publication Data

US 2023/0195139 A1    Jun. 22, 2023

Related U.S. Application Data

(63) Continuation of application No. 16/779,848, filed on Feb. 3, 2020, now Pat. No. 11,460,862.

(51) Int. Cl.
*B66F 9/06*    (2006.01)
*B25J 5/00*    (2006.01)
(Continued)

(52) U.S. Cl.
CPC .......... *B66F 9/063* (2013.01); *B25J 5/00* (2013.01); *B25J 9/1664* (2013.01);
(Continued)

(58) Field of Classification Search
CPC ........ G05D 1/0291; G05D 1/0297; G05D 2201/0216; B25J 5/00; B25J 9/1664; B25J 15/0014; B66F 9/063; B66F 9/0755; B66F 9/12; B66F 9/07504; G06F 30/13; G06T 17/00; G06T 2219/2004; H02J 7/0042;
(Continued)

(56) References Cited

U.S. PATENT DOCUMENTS 4,697,239 A * 9/1987 Sicard ............... G05B 19/4097
                                                       901/1
6,354,048 B1 * 3/2002 Gillett .................... B23Q 41/00
                                                       52/220.1

(Continued)

*Primary Examiner* — Thomas Randazzo
(74) *Attorney, Agent, or Firm* — Burris Law, PLLC

(57) ABSTRACT

A system for reconfiguring a factory having equipment at different workstations throughout the factory and a plurality of sensors disposed throughout the factory includes a factory configuration module configured to store a plurality of predetermined factory configurations and a plurality of mobile transporters configured to engage and transport the equipment to the different workstations throughout the factory based on the predetermined factory configurations and dynamic inputs, where the dynamic inputs include a status of the equipment, a status of the plurality of mobile transporters, sensor data output by the plurality of sensors, or a combination thereof.

20 Claims, 7 Drawing Sheets

(51) Int. Cl.
  *B25J 9/16* (2006.01)
  *B25J 15/00* (2006.01)
  *B66F 9/075* (2006.01)
  *B66F 9/12* (2006.01)
  *G05B 19/418* (2006.01)
  *G05D 1/00* (2006.01)
  *G06F 30/13* (2020.01)
  *G06T 17/00* (2006.01)
  *H02J 7/00* (2006.01)

(52) U.S. Cl.
  CPC ......... *B25J 15/0014* (2013.01); *B66F 9/0755* (2013.01); *B66F 9/12* (2013.01); *G05B 19/41895* (2013.01); *G05D 1/0291* (2013.01); *G05D 1/0297* (2013.01); *G06F 30/13* (2020.01); *G06T 17/00* (2013.01); *G06T 2219/2004* (2013.01); *H02J 7/0042* (2013.01)

(58) Field of Classification Search
  CPC .......... Y02P 90/02; G05B 2219/31274; G05B 19/4189; G05B 19/41865; G05B 2219/32252; G05B 19/41895
  See application file for complete search history.

(56) References Cited

U.S. PATENT DOCUMENTS

| | | | |
|---|---|---|---|
| 11,068,046 B1* | 7/2021 | Zavesky | G06Q 50/01 |
| 11,460,862 B2* | 10/2022 | Yesh | G06T 17/00 |
| 2013/0325159 A1* | 12/2013 | Kilibarda | G05B 19/41895 |
| | | | 701/25 |
| 2014/0074341 A1* | 3/2014 | Weiss | B66F 9/0755 |
| | | | 701/25 |
| 2014/0214234 A1* | 7/2014 | Worsley | G05B 19/41895 |
| | | | 701/2 |
| 2016/0297653 A1* | 10/2016 | Herre | G05D 1/0246 |
| 2019/0135549 A1* | 5/2019 | Kilibarda | B65G 35/06 |
| 2019/0242916 A1* | 8/2019 | Guarracina | B25J 5/007 |
| 2021/0070546 A1* | 3/2021 | Li | G06Q 10/047 |
| 2021/0096581 A1* | 4/2021 | Simpson | G05D 1/0016 |

* cited by examiner

DEPLOYABLE MOBILE TRANSPORTERS FOR EASY PLANT RECONFIGURATION

CROSS-REFERENCE TO RELATED APPLICATION

This application is a continuation of and claims the benefit of U.S. application Ser. No. 16/779,848, filed Feb. 3, 2020, and titled "DEPLOYABLE MOBILE TRANSPORTERS FOR EASY PLANT RECONFIGURATION", the content of which is incorporated herein by reference in its entirety.

FIELD

The present disclosure relates to industrial manufacturing, and more particularly to reconfiguring manufacturing plants to accommodate the production of a variety of products, including by the way of example, different models of motor vehicles.

BACKGROUND

The statements in this section merely provide background information related to the present disclosure and may not constitute prior art.

Manufacturing plants are typically configured for production of a number of different product models. When different product models are to be manufactured on the same assembly line, a variety of different parts and tools are located in the same fabrication/assembly station to accommodate these different product models. For example, one specific manufacturing plant may be configured for the assembly of a number of different automobile/motor vehicle models. More specifically, the Ford Mustang, Lincoln Continental, and Ford Fusion are all assembled on the same line in Flat Rock, Michigan, in metropolitan Detroit. In order to assemble different vehicles on the same assembly line, model-specific racks, parts, and tools for all vehicle models are located line-side at all times in final assembly. At any given time, for example, for every ten (10) vehicles that come down the Flat Rock assembly line, seven (7) are Mustangs, two (2) are Fusions and one (1) is a Continental. The logistics of configuring this type of assembly line is a challenge, resulting in various vehicle features rendered unbuildable due to both line-side and manufacturing constraints.

These issues associated with manufacturing multiple product models on the same assembly line, among other issues related to manufacturing different product configurations in the same plant, are addressed by the present disclosure.

SUMMARY

This section provides a general summary of the disclosure and is not a comprehensive disclosure of its full scope or all of its features.

The present disclosure provides a system for reconfiguring a factory having equipment at different workstations throughout the factory and a plurality of sensors disposed throughout the factory includes a factory configuration module configured to store a plurality of predetermined factory configurations and a plurality of mobile transporters configured to engage and transport the equipment to the different workstations throughout the factory based on the predetermined factory configurations and dynamic inputs, where the dynamic inputs include a status of the equipment, a status of the plurality of mobile transporters, sensor data output by the plurality of sensors, or a combination thereof.

In variations of this system, the factory configuration module further comprises a factory configuration planning module configured to determine new positions for the equipment based on the predetermined factory configurations and the dynamic inputs. In one variation, the system includes a supervisory control module in communication with the plurality of mobile transporters, the equipment, and the factory configuration module, where the supervisory control module comprises a path planning module configured to determine paths of travel for the plurality of mobile transporters based on the new positions determined by the factory configuration module.

In another variation, the system includes a plurality of modular power stations located at discrete work areas within the factory, where at least a set of the equipment is configured to connect to the plurality of modular power stations. The plurality of modular power stations are configured to supply at least one of electricity and pressurized fluid. In one form, the modular power stations comprise a power supply connection recessed within a floor of the factory and at least one ground pad disposed within the floor of the factory. The power supply connection is internally threaded and each of the plurality of mobile transporters includes an externally threaded power pin, a lower surface having at least one ground pad, and an internal motor, where the internal motor rotates the externally threaded power pin to secure the externally threaded power pin to the power supply connection in the floor for a modular power station among the plurality of modular power stations, which draws the lower surface of each mobile transporter towards the floor such that the ground pads of the mobile transporter and the modular power station make physical contact. Each of the plurality of mobile transporters includes a lower surface having a tapered protrusion and the floor comprises a corresponding tapered recess to locate and receive the tapered protrusion of each mobile transporter.

In another variation, each of the mobile transporters comprises a wireless power source. In another form, a charging station is provided, where the plurality of mobile transporters are configured to reposition themselves to the charging station when a power level reaches a predetermined threshold.

In one variation, the equipment may include robots that are configured to communicate with the supervisory control module. In another form, a supervisory control module is in communication with the plurality of mobile transporters, the equipment, the plurality of sensors, and the factory configuration module, where the sensor data includes at least one of geometric, thermal, acoustic, vibrational, and optical data to the supervisory control module, and where the supervisory control module is configured to determine paths of travel for the plurality of mobile transporters based on the sensor data.

In another form of the present disclosure, a method of operating a factory having equipment at different workstations throughout the factory is provided. The method comprises receiving status information from a set of the equipment and dynamic inputs, comparing the status information and dynamic inputs to a 3D model of the factory and a plurality of predetermined factory configurations to determine new positions for a set of the equipment, and transmitting control signals to a plurality of mobile transporters to engage and reposition the set of the equipment identified.

In variations of this method, the status information from the equipment is transmitted either from the set of equipment, a human-machine interface, or combinations thereof.

In one variation of the method, the mobile transporters transmit status information to a supervisory control module, the status information including position, power level, and systems status. In one form, the supervisory control module determines an order and path of repositioning for the equipment. In one form, the plurality of mobile transporters automatically move to a charging station when a power level reaches a predetermined threshold. In one form, the new position for the set of equipment is selected from the group consisting of a new workstation, a maintenance location, and a standby location. In one form, the method includes receiving an input from the factory configuration module indicating production down-time and transmitting control signals to the plurality of mobile transporters to engage and reposition equipment during the production down-time.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
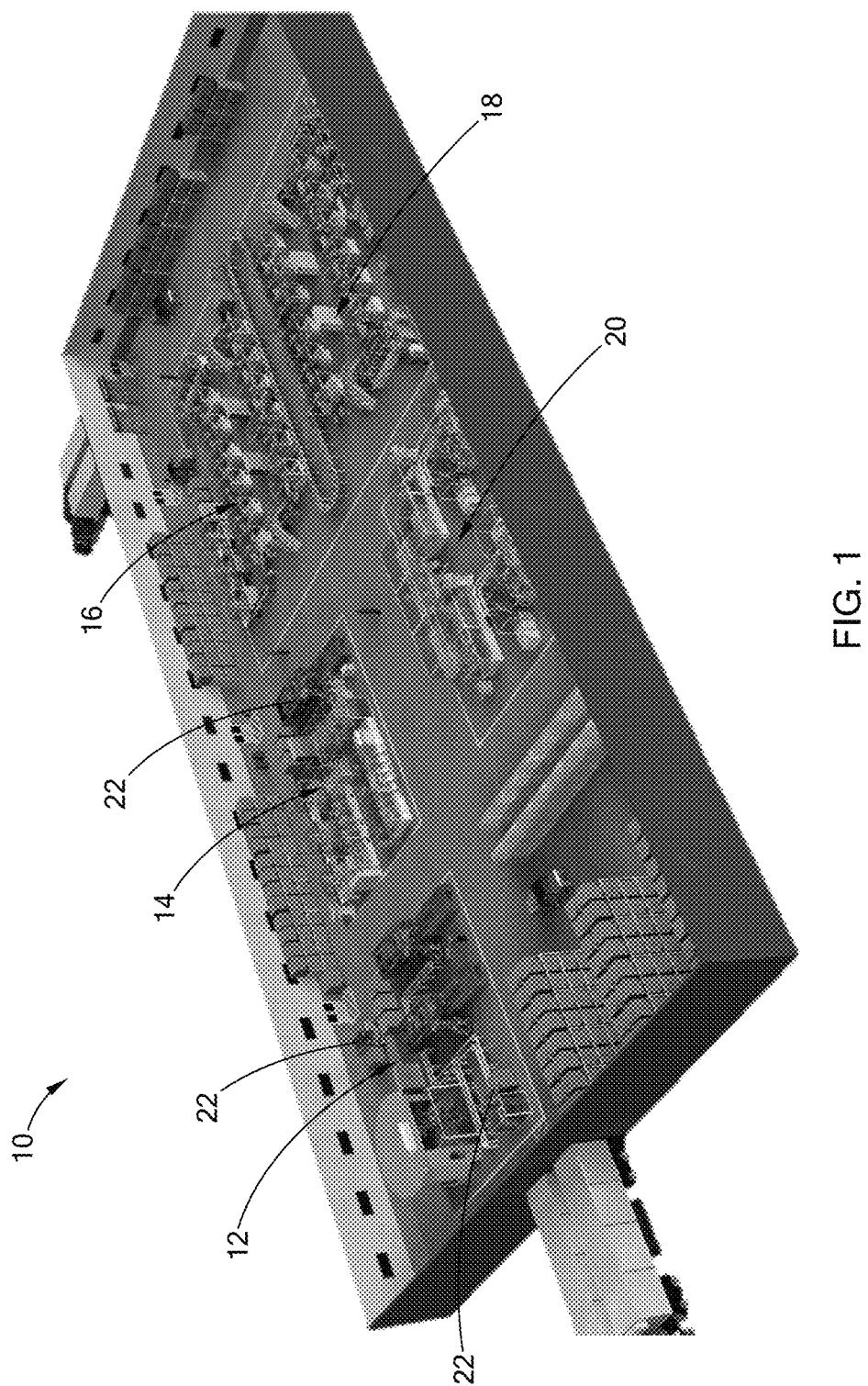
FIG. 1 is a perspective view of an exemplary factory in which the teachings of the present disclosure are employed.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIG. 1, a representative factory having equipment at different workstations is illustrated and generally indicated by reference numeral 10. A number of different workstations 12, 14, 16, 18, and 20 are shown, along with a variety of different equipment 22. As used herein, the term "equipment" should be construed to mean any tool, parts, robots, workbenches, tooling, raw materials, parts bins, among others, that is used for the manufacture or assembly of the product being manufactured, e.g. a motor vehicle. Further, although motor vehicles are described in detail herein, the teachings of the present disclosure are also applicable to other types of products, such as by way of example, aircraft, powertrains, turbine engines, commercial and residential appliances, furniture, and watercraft, among many other types of products across a variety of industries.

Generally, there are three (3) high-level components to the present disclosure. The first component is related to software to translate a 3D model of the factory 10 (also referred to as a "digital twin") and dynamic inputs into commands for a mobile-platform fleet to move equipment 22 from where it is to where it needs to go. The second component covers the means by which a mobile-platform can physically move the equipment 22. The third component is related to connecting the equipment, including providing the necessary power/systems, together after delivery.

Figure 2:
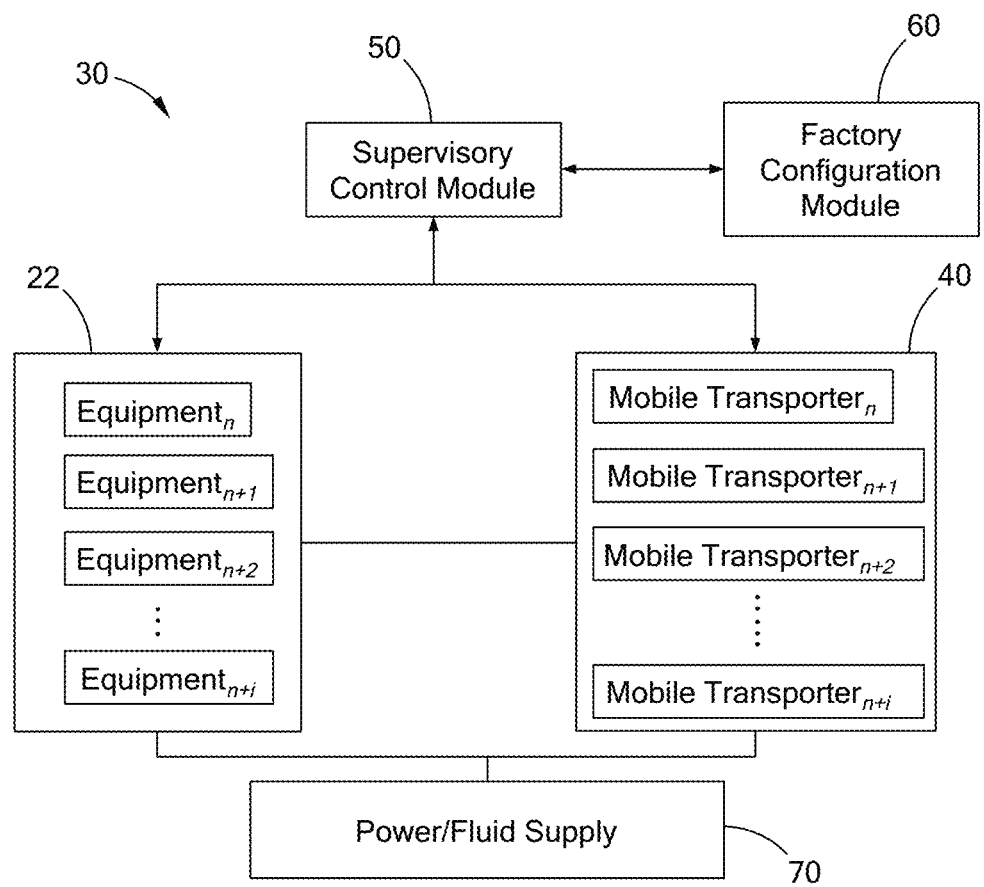
FIG. 2 is a schematic functional block diagram of components of a system for reconfiguring a factory and their relationships according to the teachings of the present disclosure.

Referring now to FIG. 2, a system for reconfiguring a factory such as that shown in FIG. 1 is illustrated and generally indicated in a functional block diagram with reference numeral 30. The system 30 includes a plurality of mobile transporters 40 that are configured to engage and transport the equipment 22 to the different workstations throughout the factory 10. The mobile transporters 40 are in communication with a supervisory control module 50, which send instructions to the mobile transporters 40 to engage and reposition the equipment 22 throughout the factory 10 based on predetermined factory configurations and dynamic inputs, as set forth in greater detail below. The system 30 also includes a factory configuration module 60, which includes a 3D model of the factory 10 and the predetermined factory configurations.

The predetermined factory configurations could be any number of configurations that have been designed to accommodate a specific production output. For example, the factory 10 could be configured with robots 24 loading parts from bins onto workbenches for manual operations in workstations 12 and 14 for a specific production quantity of vehicles, and then reconfigured to move to another workstation for loading parts from bins for a different model vehicle for its production run. In another example, a temporary inspection station may be configured between two workstations if to address an unexpected emergent issue. In another example, malfunctioning equipment may be replaced with new equipment while reducing downtime. In still another example, the width of an assembly line may be adjusted to accommodate changes in part geometries from vehicle to vehicle, thus reducing factory-induced restrictions on vehicles. One skilled in the art can appreciate that the number of possible variations and details of the predetermined factory configurations are limitless and thus the examples provided herein are merely exemplary and should not be construed as limiting the scope of the present disclosure.

The dynamic inputs can come from a variety of sources, and by way of example are provided by:

the equipment 22, and more specifically the status of the equipment 22, such as by way of example, whether the equipment 22 is: idle or in use; in need of maintenance; in need of charging or charge level (if the specific piece of equipment 22 is battery-operated); location within the factory 10; en route to a different workstation; Accordingly, each piece of equipment 22 includes at least one transmitter, and optionally at least one receiver, in order to communicate its status to the supervisory control module 50 and the mobile transporters 32;

the mobile transporters 40, and more specifically the status of the mobile transporters 40, such as by way of example, whether a mobile transporter 40 is: idle or in use; in need of maintenance; in need of charging or charge level; location within the factory 10; en route with and/or to a specific piece of equipment 22; Accordingly, each mobile transporter 40 also includes at least one transmitter and a receiver, in order to communicate with the supervisory control module 50;

output from 3D cameras located throughout the factory 10, including static and dynamic positions of objects throughout the factory 10;

output from sensors disposed throughout the factory 10, including thermal, acoustic, vibrational, and optical data;

global positioning data from any other object that is moving throughout the factory 10;

manually entered input, for example, from a user when a specific factory configuration is desired on-demand;

line status (e.g., stopped, running, trial run, others);

signal strength of smart tags (RFID, BLE, others);

estimated position when actual position of mobile transporter 40 is undetermined;

status of safety areas (i.e., clear or occupied);

high traffic areas; and known ingress/egress locations.

As further shown, the system 30 in one form includes modular power/fluid supplies 70 located at discrete work areas within the factory 10. Generally, these modular power/fluid supplies 70 provide requisite electricity/power or fluid (e.g., compressed air) for the various manufacturing/assembly operations, and are described in greater detail below.

Figure 3:
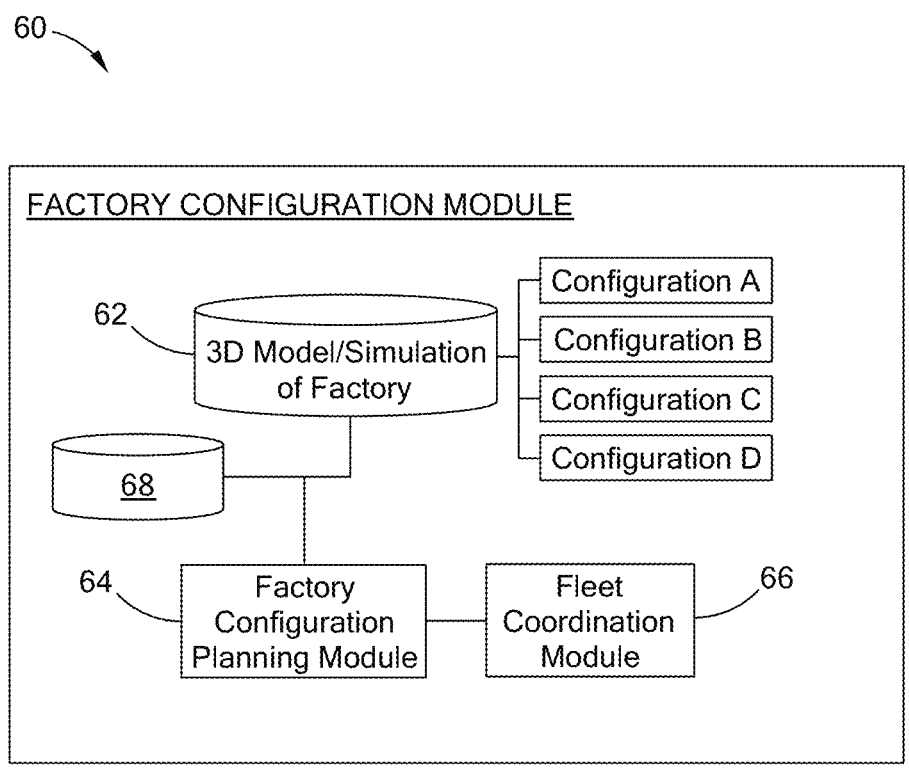
FIG. 3 is a schematic functional diagram of a factory configuration module according to the teachings of the present disclosure.

Referring now to FIG. 3, the factory configuration module 60 is generally a computing device that includes a 3D model of the factory 62 (including fixed and movable equipment), which also includes geometric objects within the factory 10 such as walls, columns/beams, doors, HVAC equipment, and generally any geometric object that is needed in order to efficiently reconfigure the factory 10 according to the teachings herein. As further shown, the 3D model of the factory 62 also includes a variety of predetermined factory configurations, depending on the product(s) being manufactured/assembled. For example, in a vehicle production factory, Configuration A may be the configuration to assemble Mustangs, Configuration B may be the configuration to assembly Mach-E Mustangs, Configuration C may be the configuration to assemble Continentals, and Configuration D may be the configuration to assemble Fusions. Each of these configurations requires specific equipment and in a specific order according to the predetermined factory configurations. Further, the 3D models also include simulations in order to visualize, test, and validate a specific factory configuration.

As further shown, the factory configuration module 60 also includes a factory configuration planning module 64 having algorithms to determine new positions for the equipment 22 based on the predetermined factory configurations and the dynamic inputs as set forth above. The factory configuration module 60 also maintains a database 68 of all mobile transporters 40 and their configurations/capabilities, which is used as input to the factory configuration planning module 64 to reconfigure the factory 10. The algorithms to determine new positions for the equipment 22 may widely vary depending on the specific factory layouts and requirements, however, such algorithms may include those disclosed in U.S. Pat. Nos. 10,532,885 and 9,409,711, the contents of which are incorporated herein by reference in their entirety.

The factory configuration module 60 may also include a fleet coordination module 66, in which the entire fleet of mobile transporters 40 can be managed and coordinated. For example, if a mobile transporter 40 having a specific lifting capacity goes down, its status is transmitted to the supervisory control module 50, which sends a signal to the factory configuration module 60. The fleet coordination module 66 then determines which replacement mobile transporter 40 is available to replace the down mobile transporter 40, and then sends a signal to the supervisory control module 50 to activate that specific replacement mobile transporter 40. The fleet coordination module 66 may also be configured to manage use of the mobile transporters 40 according to maintenance schedules and other operational conditions, such as by way of example, level of battery charge.

Figure 4:
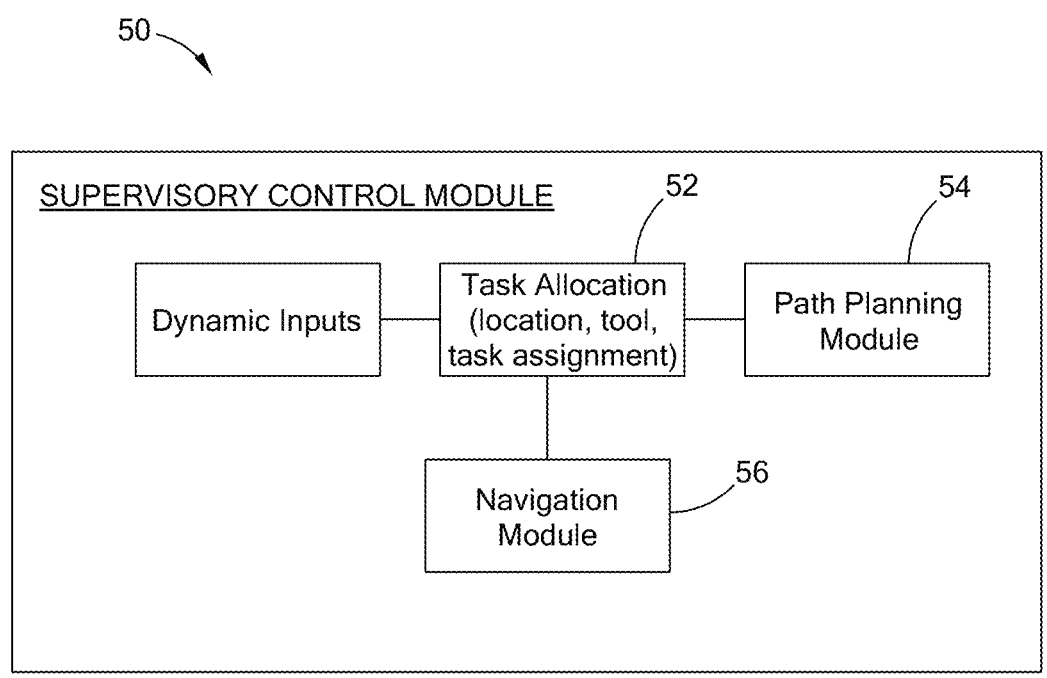
FIG. 4 is a schematic functional diagram of a supervisory control module according to the teachings of the present disclosure.

Referring to FIG. 4, the supervisory control module 50 is generally a computing device programmed to execute specific programs based on the dynamic inputs received from the equipment 22 and the mobile transporters 40, and commands from the factory configuration module 60, or task allocations 52. For example, when a mobile transporter 40 has completed moving a piece of equipment 22 from one workstation to another workstation, the mobile transporter 40 transmits a signal to the supervisory control module 50 indicating that the equipment 22 has been moved and that the mobile transporter 40 is idle and ready for another task. The factory configuration module 60 sends commands for additional equipment 22 be relocated to complete reconfiguration of the factory 10, and the supervisory control module 50 sends a control signal to the idle mobile transporter 40 to move another piece of equipment 22 according to the commands from the factory configuration module 60.

In one form, the supervisory control module 50 include a path planning module 54 that includes algorithms to determine paths of travel for the mobile transporters 40. This path planning module 54 also receives dynamic inputs and data from the factory configuration module 60, including relevant geometry from the 3D factory models, and plans paths for the mobile transporters 40 to move the equipment 22 in the most efficient manner. A navigation module 56 communicates with the equipment 22 and the mobile transporters 40, which receives global positioning data and sends new locations along with the paths (where applicable) from the path planning module 54.

Figure 5:
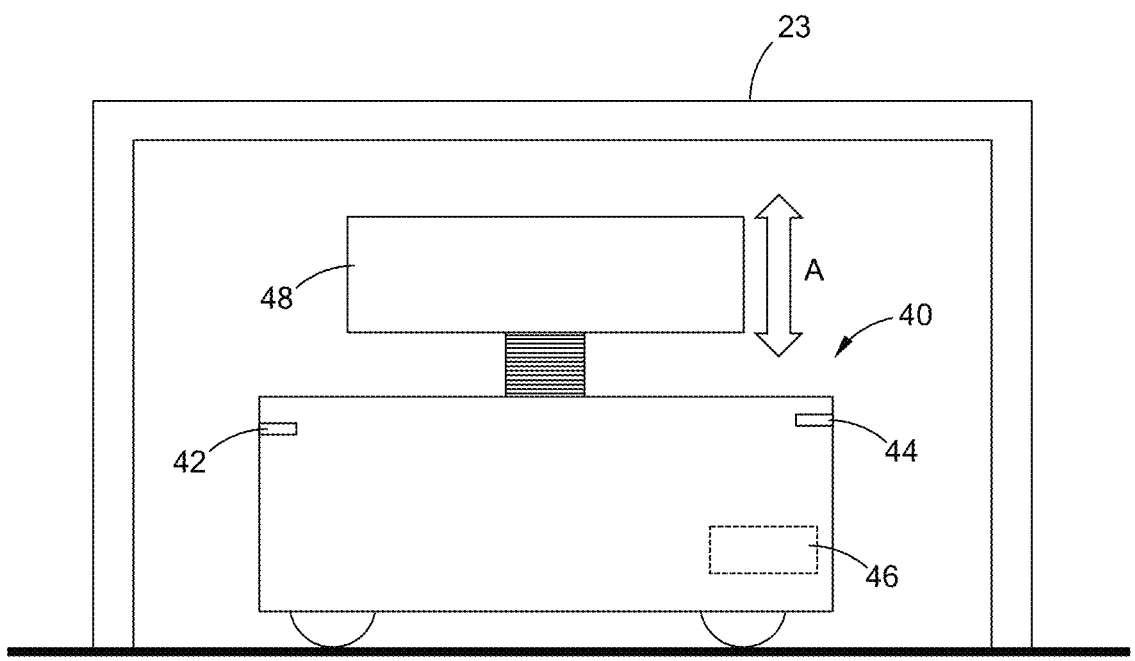
FIG. 5 is a schematic illustration of a mobile transport device and a piece of equipment disposed on a factory floor according to the teachings of the present disclosure.

Referring now to FIG. 5, an exemplary mobile transporter 40 is shown in greater detail, positioned below a piece of equipment 22, which in this example is a workbench 23. Each mobile transporter 40 includes a transmitter 42, a receiver 44 (which may be in the same device rather than separate devices as illustrated), at least one proximity sensor 46, and an engagement mechanism 48 for engaging the equipment 22 for transport. As set forth above, transmitter 42 transmits dynamic inputs of the status of the mobile transporter 40 to the supervisory control module 50, and the receiver 44 receives command signals from the supervisory control module 50. The command signals generally include stop and start commands, and path commands, among others.

The proximity sensor 46 may be any of a variety of sensors including optical, mechanical, magnetic, and combinations thereof. Generally, the proximity sensor 46 functions to locate the mobile transporter 40 relative to the equipment 22, or relative to any other object (whether static or dynamic) within the factory 10.

The engagement mechanism 48 may take any number of configurations, and in this illustrative form includes a linear pad that moves up and down along the direction of arrow A.

The linear pad 48 is moved upwards to engage the lower surface of the workbench 23 and lift the workbench off the factory floor for relocation to another workstation. Of course, it should be appreciated that any number and type of engagement mechanisms 48 may be employed, depending on the equipment that is to be relocated. For example, there may be multiple engagement mechanisms 48, including latches/hooks, and the engagement mechanisms 48 may be mechanical, magnetic, or combinations thereof while remaining within the scope of the present disclosure. Further, the mobile transporter 40 may take any number of forms and may be completely mobile or partially mobile (e.g., an overhead crane or a robotic arm with an end effector). A mobile transporter 40 may further include an "engine" such as the Kuka KMP 1500 mobile platform, which could be modified to communicate with the various components of the system 30 described herein.

The mobile transporters 40 in one form include a wireless power source (not shown), which may be a battery or a self-powering device such as a thermoelectric vibration device. As the mobile transporters 40 traverse the factory, they could generate some power through such a self-powering device. Although not shown, the present disclosure further contemplates a charging station, wherein the mobile transporters 40 are configured to reposition themselves to the charging station when a power level reaches a predetermined threshold. Either the mobile transporter 40 could reposition itself, or commands could come from the supervisory control module 50 through the factory configuration module 60 and its associated fleet coordination module 66.

Advantageously, the present disclosure also includes modular power stations located at discrete workstations within the factory 10, in which at least some of the equipment 22 is configured to connect to, and disconnect from, the modular power stations. Generally, the modular power stations are configured to supply electricity and/or pressurized fluid. As used herein, the term "fluid" should be construed to mean a liquid, gas, or plasma. For example, in one case, the pressurized fluid may be pressurized air (or "shop air") to operate pneumatic tools.

Figure 6:
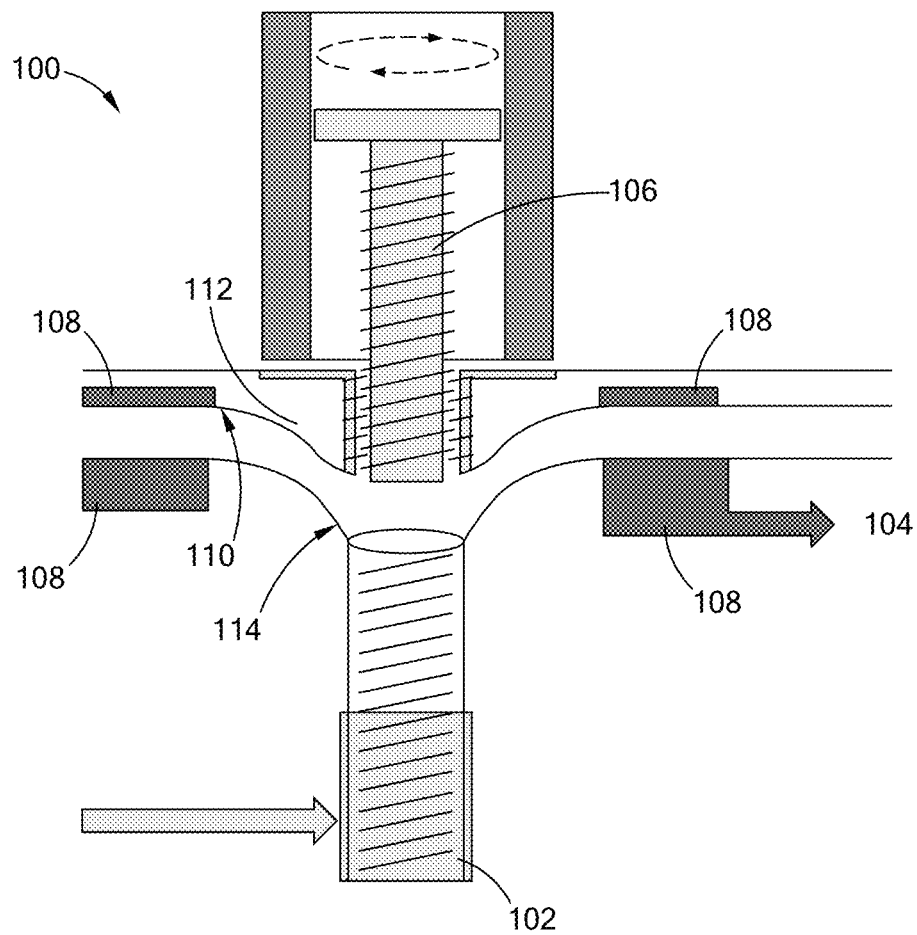
FIG. 6 is a schematic cross-sectional view of a modular power station according to the teachings of the present disclosure.

Referring to FIG. 6, one such example of a modular power station is illustrated and generally indicated by reference numeral 100. In this form, the modular power station 100 includes a power supply connection 102 recessed within a floor 104 of the factory 10. The power supply connection 102 in this form is a hollow conductive post that is internally threaded. The mobile transporter 40 also includes a power pin 106, which in this form is externally threaded and engaged with an internal motor (not shown) for rotation of the power pin 106 and engagement with the power supply connection 102 in the floor 104. Further, ground pads 108 on both the mobile transporter 40 and the floor 104 provide for electrical grounding therebetween. As the power pin 106 of the mobile transporter 40 is rotated and translates downward, threaded engagement with the power supply connection 102 draws the mobile transporter 40 towards the floor 104 until the ground pads 108 make physical contact.

As further shown, the mobile transporter 40 includes a lower surface 110 having a tapered protrusion 112, and the floor 104 comprises a corresponding tapered recess 114. Accordingly, the mobile transporter 40 may be more easily located and engaged with the modular power station 100. It should be understood that this specific arrangement of a modular power station 100 is merely exemplary and should not be construed as limiting the scope of the present disclosure.

In another form of the present disclosure, the mobile transporters 40 and equipment 22 (for example, a robot) are configured for wireless power transfer. In other words, either one or both of the mobile transporter 40 and the equipment 22 is able to charge each other if a power level is below a threshold value on one component (e.g. equipment 22) and a power level is above an upper threshold value of the other component (e.g. mobile transporter 40). The commands for charging may come from the supervisory control module 50, or the charging may be local to the mobile transporter 40 and equipment 22.

Figure 7:
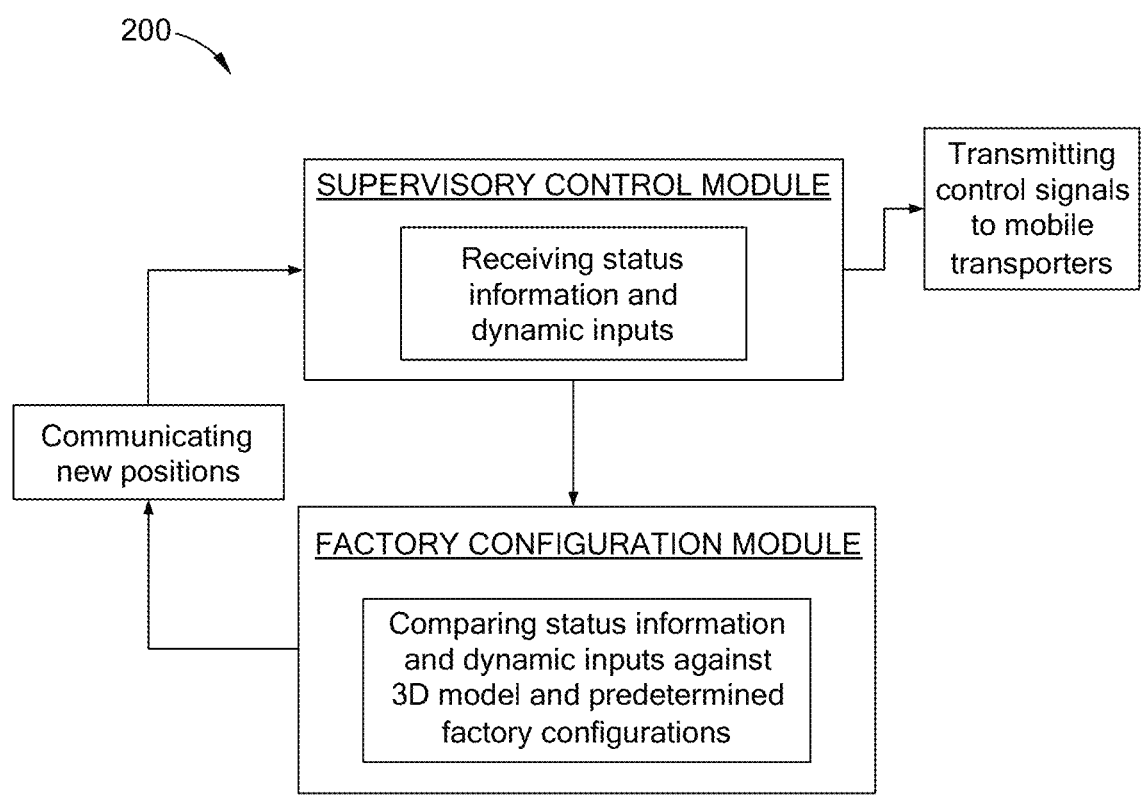
FIG. 7 is a flow diagram illustrating a method according to the teachings of the present disclosure.

Referring now to FIG. 7, a method according to the teachings of the present disclosure is illustrated and generally indicated by reference numeral 200. The method 200 includes operating a factory having equipment at different workstations throughout the factory as previously set forth and comprises receiving status information from the equipment and dynamic inputs at a supervisory control module, comparing the status information and dynamic inputs against a 3D model of the factory and a plurality of predetermined factory configurations in a factory configuration module to determine new positions for the equipment, communicating the new positions from the factory configuration module to the supervisory control module, and transmitting control signals from the supervisory control module to a plurality of mobile transporters to engage and reposition equipment identified from the comparing step that require repositioning, wherein the plurality of mobile transporters engage and transport the equipment to the new positions throughout the factory.

The status information (which is a part of the dynamic inputs as set forth above) from the equipment is transmitted either directly from the equipment, from a human-machine interface, or combinations thereof. Further, the supervisory control module determines an order and path of repositioning for the equipment as previously set forth, and in one form, with the previously described path planning module. The new positions for the equipment may include a new workstation, a maintenance location, or a standby location, among others.

In one variation of this method, the supervisory control module receives input from the factory configuration module indicating production down-time and transmits control signals to the plurality of mobile transporters to engage and reposition equipment during the production down-time.

Advantageously, the system according to the teachings of the present disclosure is configured for autonomous reconfiguration of a factory/plant as a function of the status of equipment, manufacturing demand, free space, time and distance to move equipment, and other constraints within a factory/plant. The following examples of use cases are provided to demonstrate the flexibility and agility of the system 30, and for further enablement, and should not be construed as limiting the scope of the present disclosure.

Example 1: Multiple Vehicle Models on Same Assembly Line

To accomplish assembling multiple vehicles on the same assembly line, the right racks, parts and tools ("equipment") for all vehicles and model variations should remain line-side at all times in final assembly (and this is not even taking into account paint or body operations). The model mix may be such that for each ten cars that come down the assembly line, seven are one model, two are another model, and one is yet another model. To set this up logistically is a challenge, resulting in various vehicle features rendered unbuildable due to both line-side and manufacturing constraints.

With the teachings of the present disclosure, the factory could be re-configured in a short period of time (e.g. over the weekend), so that one model is built one week, then another model the next week, potentially with a mid-week overnight reconfiguration. The factory can then be reconfigured back to a different model assembly for the following week. At any given time, the factory is dedicated to building one vehicle model, allowing much more versatility to specialization for each vehicle assembly line.

Example 2: On-Demand Manufacturing

The teachings of the present disclosure further enable changing what factories build based on demand and location to suppliers/customers. Currently, many factories are designed to build a single vehicle, but as vehicle demand increases or decreases, the manufacturer may wish to have more or less factories producing the vehicles. If cost and time to reconfigure are significantly reduced, overhaul can be completed during down time to begin producing new vehicle lines.

Example 3: Launching New Vehicles

Launching new vehicle models, especially top-selling vehicles, presents a unique challenge. There is strong motivation to keep the line running as long as possible and shutting down for as short a time as possible during the transition. The teachings of the present disclosure provide a way to quickly re-configure the factory, potentially enabling the factory to shift between new and old model-line types quickly (e.g. over weekends or other regular down time). In this manner, several test-production vehicles can be produced on the full line but production could then switch back to the standard vehicle production as issues with the new vehicle process are investigated and resolved.

Example 4: Real-Time Reconfiguration

The teachings of the present disclosure can further enable reconfiguration of the factory while workers are still working on the assembly line, thus reducing down-time. The most extreme case would enable reconfiguring the plant for each vehicle, enabling any vehicle to be produced at any plant in any order.

Example 5: Rapid Replacement of Failed Equipment

The teachings of the present disclosure can also enable rapid replacement of failed equipment. When equipment fails on the assembly line, replacement equipment can be quickly dispatched to the location and damaged equipment can be removed to a service center for repair.

Example 6: Just-In-Time (JIT) Factory Reconfiguration

With the ability to quickly re-arrange the factory with the teachings of the present disclosure, the factory layout can be reimagined, where parts/tools are moved away from the line "just in time" when other vehicles need to navigate through the space. This offers a unique flexibility in the plant layout design.

Additional Examples

The following are further non-limiting examples of various forms of the present disclosure and the different ways in which a factory may be configured using the teachings of the present disclosure.

Due to current vehicle supply or customer demand, the factory could decide to switch to producing a specific vehicle, such as by way of example, the Mustang. The plant manager would select the predetermined factory configuration for the Mustang assembly line. The factory configuration module 60 will then start comparing what equipment is currently available in the factory. If all of the equipment is available, the factory configuration module 60 then proceeds with creating all the movement routes for the mobile transporters 40 along with the estimated time to complete reconfiguration of the factory. If required equipment 22 is missing, the factory configuration module 60 alerts the plant manager, who can execute corrective action accordingly. Once a shift is completed, the plant manager can instruct the system 30 to execute the change. The system 30 will begin the disconnection process whether it be by (1) human, (2) mobile transporter 40, (3) robotic arm (a form of equipment 22), or (4) the equipment 22 is able to decouple itself. Once a sufficient amount of equipment 22 is disconnected, the supervisory control module 50 deploys the mobile transporters 40, along with ancillary autonomous tugs and forks to begin rearranging the equipment. Further equipment 22 can be disconnected while the first set of equipment 22 gets moved/placed. Once the equipment 22 reaches its final destination, it can start being hooked up and secured while the rest of the equipment 22 is being moved/placed. After completion of the reconfiguration, workers return to work after the weekend or extended break.

A new vehicle model, such as by way of example, the new Bronco becomes quite popular and exceeds all expectations, while the factory begins to outsell its manufacturing capability. With the teachings of the present disclosure, a 3D model of a plant for a previous model (such as an Escape) can be redesigned into Bronco factory. Once that is complete, the plans can be sent to the plant manager for review. The plant manager can load the plans into the system 30, which will check existing equipment 22 availability versus equipment 22 required for the new factory configuration. Any missing equipment 22 can be shipped to the factory before the reconfiguration occurs. Once all the equipment 22 is available, the factory can be reconfigured following generally the same steps in the previous example. Finally, employees return to work and begin assembling the Bronco, making up for the supply shortage while no longer overproducing the Escape.

With new model/vehicle launches, it is challenging to test how the new factory configuration will work as it is disruptive to the existing products being manufactured at the factory. Once changes are made to the assembly line, they can potentially be permanent, meaning the old vehicle may not be able to be manufactured on that same assembly line, at least not in the same manner as before. To reduce the inefficiencies associated with the rollout of new models/vehicles, the system 30 can be utilized to switch between old and new assembly lines during regularly scheduled breaks. Engineers can design a factory configuration for the new model vehicle, submit it to the plant manager for approval and initialization of the factory reconfiguration process. The factory could manufacture the new vehicle for a test period before reconfiguring back to the original assembly line. Engineers can collect data over this short test period to determine potential improvements to the factory layout for future testing. This process of switching between old and new, with each iteration being different, allows for the agile development and feedback of potential factory changes. Once the vehicle is ready to launch, many different potential factory configurations could have been tested, enabling a more optimal configuration to be selected before the final reconfiguration for launch is executed.

Although very challenging, a variation of the teachings of the present disclosure could be used to transform a factory during active operation. Because vehicles are assembled in stages, the factory configuration for the next stage of the vehicle build need only be completed before the vehicle arrives. The system 30 can enact partial-plant reconfigurations during shorter downtimes (e.g. lunch hour). In this manner, the factory could be reconfigured segment-by-segment while vehicles continue to be built. For example, the system 30 would start dispatching mobile transporters 40 such that they are at the assembly line location when workers' lunches start. While workers are out for lunch, the factory reconfiguration process occurs on their part of the assembly line. As workers come back from lunch, they would be building an entirely different vehicle. The workers could even be posted new work locations or get a mass text message, based on the new plan and work configuration.

In some cases, the mobile transporters 40 could move down the assembly line in order, adjusting the process for every vehicle. This process could enable build cells for extremely customizable vehicles as well as cycling out the equipment such as modification shop of special decals, among others. For low-volume vehicles, robots can be brought to the work, rather than moving work to robots.

Yet another application is envisioned by the present disclosure when robotic manipulators fail on the assembly line. When this occurs, production is halted until the manipulators can be repaired or replaced. Using the system 30 outlined herein, when a call is placed to the plant manager regarding equipment failure, she could simply flag the equipment 22 to be replaced in the factory configuration module 60. The system 30 would then mobile transporters 40 to disconnect and remove the failed robotic manipulator while simultaneously dispatching mobile robot(s) to install a replacement manipulator. In this manner, the total down time for the assembly line can be reduced, as repairs on the failed equipment do not need to made line-side during assembly.

An advantage of the automated factory reconfiguration system 30 of the present disclosure over traditional solutions is that there is little room for human error. The ability to retain change tool and process locations without having to dismantle and re-lay concrete or other infrastructure is also achieved. Factories can alter configuration when workers are off-shift (e.g. on break or over seasonal shutdowns). A more agile factory environment allows workers to implement process improvements easier, faster and cheaper. The present disclosure provides a more complete end-to-end solution, including the planning phase, physical movement and installation of equipment, as well as the full reconfiguration of the factory.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term "module" and/or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A system for reconfiguring a factory having equipment at different workstations throughout the factory and a plurality of sensors disposed throughout the factory, the system comprising:
   a factory configuration module configured to store a plurality of predetermined factory configurations; and a plurality of mobile transporters configured to engage and transport the equipment to the different workstations throughout the factory based on the predetermined factory configurations and dynamic inputs, wherein the dynamic inputs include a status of the equipment, a status of the plurality of mobile transporters, sensor data output by the plurality of sensors, or a combination thereof.

2. The system according to claim 1, wherein each of the mobile transporters comprises a wireless power source.

3. The system according to claim 1 further comprising a charging station, wherein the plurality of mobile transporters are configured to reposition themselves to the charging station when a power level reaches a predetermined threshold.

4. The system according to claim 1 further comprising a supervisory control module in communication with the equipment, wherein the equipment comprises robots that are configured to communicate with the supervisory control module.

5. The system according to claim 1, wherein the factory configuration module further comprises a factory configuration planning module configured to determine new positions for the equipment based on the predetermined factory configurations and the dynamic inputs.

6. The system according to claim 5 further comprising a supervisory control module in communication with the plurality of mobile transporters, the equipment, and the factory configuration module, wherein the supervisory control module comprises a path planning module configured to determine paths of travel for the plurality of mobile transporters based on the new positions determined by the factory configuration module.

7. The system according to claim 1 further comprising:
a supervisory control module in communication with the plurality of mobile transporters, the equipment, the plurality of sensors, and the factory configuration module, wherein the sensor data includes at least one of geometric, thermal, acoustic, vibrational, and optical data to the supervisory control module, and wherein the supervisory control module is configured to determine paths of travel for the plurality of mobile transporters based on the sensor data.

8. The system according to claim 7, wherein the geometric data comprises static and dynamic positions of objects within the factory.

9. The system according to claim 1 further comprising a plurality of modular power stations located at discrete work areas within the factory, wherein at least a set of the equipment is configured to connect to the plurality of modular power stations.

10. The system according to claim 9, wherein the plurality of modular power stations are configured to supply at least one of electricity and pressurized fluid.

11. The system according to claim 9, wherein the modular power stations comprise:
a power supply connection recessed within a floor of the factory; and
at least one ground pad disposed within the floor of the factory.

12. The system according to claim 11, wherein the power supply connection is internally threaded and each of the plurality of mobile transporters includes:
an externally threaded power pin;
a lower surface having at least one ground pad; and
an internal motor,
wherein the internal motor rotates the externally threaded power pin to secure the externally threaded power pin to the power supply connection in the floor for a modular power station among the plurality of modular power stations, which draws the lower surface of each mobile transporter towards the floor such that the ground pads of the mobile transporter and the modular power station make physical contact.

13. The system according to claim 11, wherein each of the plurality of mobile transporters includes a lower surface having a tapered protrusion and the floor comprises a corresponding tapered recess to locate and receive the tapered protrusion of each mobile transporter.

14. A method of operating a factory having equipment at different workstations throughout the factory, the method comprising:
receiving status information from a set of the equipment and dynamic inputs;
comparing the status information and dynamic inputs to a 3D model of the factory and a plurality of predetermined factory configurations to determine new positions for a set of the equipment; and
transmitting control signals to a plurality of mobile transporters to engage and reposition the set of the equipment identified.

15. The method according to claim 14, wherein the status information is received from the set of the equipment, a human-machine interface, or combinations thereof.

16. The method according to claim 14, wherein the mobile transporters transmit status information to a supervisory control module, the status information including position, power level, and systems status.

17. The method according to claim 14 further comprising determining an order and path of repositioning for the equipment.

18. The method according to claim 14, wherein the plurality of mobile transporters automatically move to a charging station when a power level reaches a predetermined threshold.

19. The method according to claim 14, wherein the new positions for the set of the equipment are selected from the group consisting of a new workstation, a maintenance location, and a standby location.

20. The method according to claim 14 further comprising receiving an input indicating production down-time and transmitting control signals to the plurality of mobile transporters to engage and reposition the equipment during the production down-time.

* * * * *